(12) United States Patent
Schmatz et al.

(10) Patent No.: US 6,981,168 B2
(45) Date of Patent: Dec. 27, 2005

(54) CLOCK DATA RECOVERY SYSTEM

(75) Inventors: Martin Schmatz, Rueschlikon (CH);
Christian Menofli, Zurich (CH);
Thomas Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 10/284,547

(22) Filed: Oct. 30, 2002

(65) Prior Publication Data

US 2003/0128786 A1    Jul. 10, 2003

(30) Foreign Application Priority Data

Jan. 8, 2002    (EP) .................................. 02405006

(51) Int. Cl.⁷ .............................................. G06F 1/04
(52) U.S. Cl. ...................... 713/500; 713/501; 713/502; 713/503; 713/600; 375/344; 375/345; 375/346; 714/700; 714/704; 714/716
(58) Field of Search ................................ 713/500–503, 713/600; 375/344, 345, 346; 714/700, 704, 714/7

(56) References Cited

U.S. PATENT DOCUMENTS

| | | | | |
|---|---|---|---|---|
| 3,238,462 A | * | 3/1966 | Ballard et al. ............... | 327/160 |
| 3,959,601 A | * | 5/1976 | Olevsky et al. .............. | 375/376 |
| 4,339,823 A | * | 7/1982 | Predina et al. ............... | 375/294 |
| 4,590,602 A | * | 5/1986 | Wolaver ...................... | 375/375 |
| 5,276,712 A | * | 1/1994 | Pearson ...................... | 375/360 |
| 5,315,270 A | * | 5/1994 | Leonowich .................. | 331/1 A |
| 5,381,116 A | * | 1/1995 | Nuckolls et al. ............. | 331/1 A |
| 5,497,402 A | * | 3/1996 | Pyo et al. .................... | 375/344 |
| 5,525,935 A | * | 6/1996 | Joo et al. ....................... | 331/11 |
| 5,548,679 A | * | 8/1996 | Kiyota ....................... | 388/811 |
| 6,337,886 B1 | * | 1/2002 | Asahi .......................... | 375/316 |
| 6,362,670 B1 | * | 3/2002 | Beaulieu ..................... | 327/156 |
| 6,542,039 B1 | * | 4/2003 | Ogura .......................... | 331/11 |

* cited by examiner

Primary Examiner—Lynne H. Browne
Assistant Examiner—Nitin C. Patel
(74) Attorney, Agent, or Firm—Keusey, Tutunjian & Bitetto, P.C.; Wan Yee Cheung, Esq.

(57) ABSTRACT

A clock data recovery system is provided for resampling a clock signal according to an incoming data signal stream. It comprises a clock generator for generating said clock signal wherein one of the frequency and phase of that clock signal is dependent upon a control signal. It is further provided a phase detector operable to detect the phase difference between said clock signal and said incoming data signal stream and is operable to generate a phase difference signal. A loop controller has a variable-gain and is operable to control said clock generator by generating said control signal. That control signal is dependent in said phase difference signal and that variable-gain. The variable-gain is dependent upon a transition rate of the incoming data signal stream. The loop controller can comprise a low-pass filter to generate from the phase difference signal a low-pass filered phase signal and to adjust the bandwidth of the clock data recovery system. The loop controller further can comprise a variable-gain element to amplify the filtered signal in accordance with a received bit transition rate provided by a bit transition detector and a density calculator.

11 Claims, 2 Drawing Sheets

CLOCK DATA RECOVERY SYSTEM

The present invention is related to a clock data recovery system especially to a clock data recovery system with an adjustable gain.

BACKGROUND OF THE INVENTION

During the serial transmission of random data streams the number of data transitions from one to zero and zero to one, respectively, is not constant when counted over a given number of transmitted bits. This results in a variation of the bit transition density, which depends on what type of line code is used, e.g. 8B10B, scrambling, 10 Gb Ethernet etc. The bit-transition-density-variation ranges from three guaranteed transitions in ten bits to one transition only for more than 100 transmitted bits.

To resample a clock on which the data stream is based, clock data recovery systems are used. Conventional clock data recovery systems are generating a control loop error signal from the measurement of timing of when a transition in the incoming data signal stream occurs. This information is used to speed up or slow down the local resampling clock.

The bandwidth of a clock-data-recovery system is determined by the number of update measurements divided by the measurement interval. Even though serial data is usually transmitted in a balanced form (e.g. same number of ones and zeros and constant transition over a long time period) the short-term transition density and therefore the loop-update density may vary considerably. Therefore the gain and the bandwidth of the clock data recovery system loop is also varying and not well predictable.

From U.S. Pat. No. 5,896,067 a clock data recovery system is known wherein a clock signal is resampled from a signal having variations in the bit rate. The clock-data-recovery system includes a phase lock loop for recovering a bit clock from an incoming signal stream and means for resetting the output frequency of the phase lock loop to a preset value if that phase lock loop loses its lock or if adverse conditions are detected.

The disadvantage of that clock-data-recovery system lies in an insufficient accuracy of the resampled clock related to the incoming data signal stream, especially when the bit transition rate of the incoming signal stream is low. The loop may be reset onto a predetermined frequency if the phase lock loop of the clock-data-recovery system loses its lock. This may result in a continuous restarting of adjusting the frequency of the phase lock loop onto the incoming data signal stream. Thus the adjusting of the frequency may continuously restart from the preset frequency value that effectively differs from a frequency of a resampled clock optimized to the incoming signal stream.

SUMMARY OF THE INVENTION

According to a first aspect of the present invention, an improved clock-data-recovery system is provided, especially a clock-data-recovery system that enables the resampling of a clock signal from an incoming signal stream that has a very low bit transition rate.

This is achieved by providing a clock data recovery system according to claim 1 and a method for resampling a clock signal according to an incoming data signal stream according to claim 9.

A clock data recovery system is provided for resampling a clock signal according to an incoming data signal stream. The clock data recovery system comprises a clock generator generating the clock signal wherein the frequency and/or phase of the clock signal is dependent upon a control signal. The system further comprises a phase detector operable to detect a phase difference between the clock signal and the incoming data signal stream and is operable to generate a phase difference signal. Furthermore a loop controller having a variable gain is provided, which is operable to control the clock generator by generating the control signal. The control signal is dependent upon the phase difference signal and the variable gain. The variable gain is dependent upon a bit transition rate of the incoming data signal stream.

According to another aspect of the present invention, a method for resampling a clock signal from an incoming data signal stream is provided wherein the clock signal is resampled according to the incoming data signal stream. According to that method, the clock signal is generated dependent upon a control signal. A phase difference between the incoming data signal stream and the clock signal is detected and the phase difference is evaluated to obtain a phase difference signal. The obtained phase difference signal is amplified using a variable-gain. The bit transition rate of the incoming data signal stream is determined and the variable-gain is adapted to the bit transition rate of the incoming data signal stream.

One main advantage of the present invention is that the control loop is correcting any timing offset between the incoming data stream and the clock in an improved fashion. The reason for this improvement lies in the fact that the residual error of a feedback-based control loop is limited to $1/(1+A)$, where A is the open-loop gain of the control loop. The higher the gain the smaller is the residual error.

Additionally an increased gain also increases the loop bandwidth so that an error, i.e. phase difference between a transition of a resampled clock signal and a bit transition of the incoming data stream, is corrected faster. In other words, the smaller the bit transition density, the more aggressively, i.e. using larger increments, the control signal is adjusting the frequency of the clock generator. Thus, the more transitions the incoming data signal stream has per time period, the faster it can adjust the clock generator via the control signal and the smaller the increments for adjusting the clock generator can be. Therefore a larger bandwidth can be achieved. Thus, having a small bit transition density, the gain is set high, and therefore stronger and more aggressive corrections steps are made to readjust the frequency of the clock generator.

Adjusting the gain of the clock data recovery loop has the same effect as a variable bandwidth which can be implemented e.g. by a low-pass filter. In contrast thereto, a variable gain is easier to implement e.g. by using a variable-gain element.

Further advantageous embodiments of the inventions are disclosed in the dependent claims.

In a preferred embodiment of the invention the variable gain is increased dependent on a decrease of the bit transition rate, preferably in a manner to provide a constant gain-bandwidth-product. This has the advantage that even at low bit transition rates of the incoming data signal stream an advantageous bandwidth of the clock data recovery system can be maintained, resulting in a quick adjusting of the resampled clock signal. A further advantage is that the preferred relationship is easy to implement while being very effective in adapting the clock signal generation to the bit transition rate.

According to another preferred embodiment of the invention, the loop controller includes a low-pass filter and a variable-gain element. The low-pass filter can be connected with the phase detector to low-pass filter the phase difference signal and to adjust the bandwidth of the clock data recovery system. The variable-gain element is operable to amplify the low-pass filtered phase difference signal dependent upon the variable-gain to obtain the control signal. This embodiment has the advantage that bandwidth and gain can be set up separately wherein the bandwidth of the system is determined by the low-pass filter and the gain is determined by the variable-gain element.

Preferably, the variable-gain element is operable to receive the bit transition rate of the incoming signal data stream and to vary the gain related to the received transition rate. This has the advantage that the variable-gain element is easy to realize if separated from the low-pass filter.

The clock generator preferably includes a voltage-controlled oscillator wherein the control signal is a voltage potential. Voltage-controlled oscillators are standard devices for realizing phase lock loop circuits and especially preferred because they can be controlled by a voltage-potential serving as a control signal.

In another preferred embodiment, the clock data recovery system further includes a transition detector element to determine the bit transition rate of the incoming data signal stream. The transition detector element can be operable to determine the transition rate by counting a number of transitions of the incoming data signal per time interval. The providing of the transition detector element is advantageous because it is easy to implement. The bit transition rate is calculated by the number of transitions of the incoming data signal stream per time interval divided by maximum number of bit transitions of the incoming data signal stream per time interval or the total number of transitions of the local clock signal, respectively. To obtain a bit transition rate relative to a maximum or total number of transitions, also a subtraction of the counted number of bit transitions of the incoming data signal stream and the total number of transitions may be appropriate.

BRIEF DESCRIPTION OF THE DRAWINGS

A preferred embodiment of the present invention will now be described by an example with reference to the drawings, in which.

DETAILED DESCRIPTION OF PREFERRED EMBODIMENTS

Figure 1:
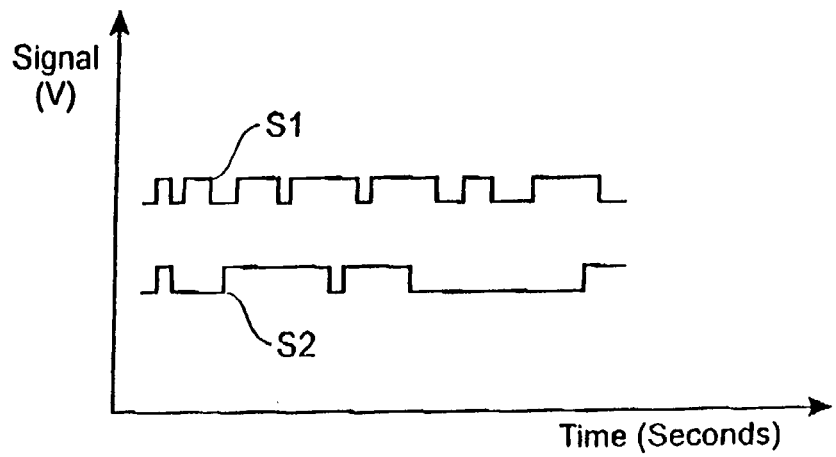
FIG. 1 shows a timing diagram with a bit transition density of two different signal streams of equal bit rate.

During the serial transmission of random data streams the number of data transitions from one to zero and zero to one respectively are not constant when counted over a given number of transmitted bits. This results in a variation of the bit transition density of the data signal stream. In FIG. 1 two different data signal streams are depicted. A first data signal stream S1 shows a data signal that has a larger bit transition density than a second data signal stream S2. Both data signal streams S1, S2 provide the same number of transmitted bits per time period although in the second data signal stream S2 more non-changing bits in a row occur than in the first data signal S1. For both data signal streams S1, S2 a clock data recovery system is resampling a clock signal with the same frequency.

These different types of signal data streams result from the type of line code that is used. Typical line codes may be e.g. 8B10B, scrambling, 10 Gb Ethernet etc. The different type of line codes provide a minimum transmission density that may go from three guaranteed transitions in 10 bits to one transition only for more than 100 transmitted bits.

Receiving such a data signal stream without providing a referring clock signal makes it difficult to regain the information of the data signal. If no referring clock signal is provided, a clock data signal is resampled using the incoming data signal stream. If the bit transition density is very low, it is difficult to recover a clock signal from the very few transition occurrences available. So it is possible that the adjusting of the clock generator onto the optimised frequency and/or phase relation is too slow because the bit transitions occurring in the incoming data signal stream are too infrequent.

Figure 2:
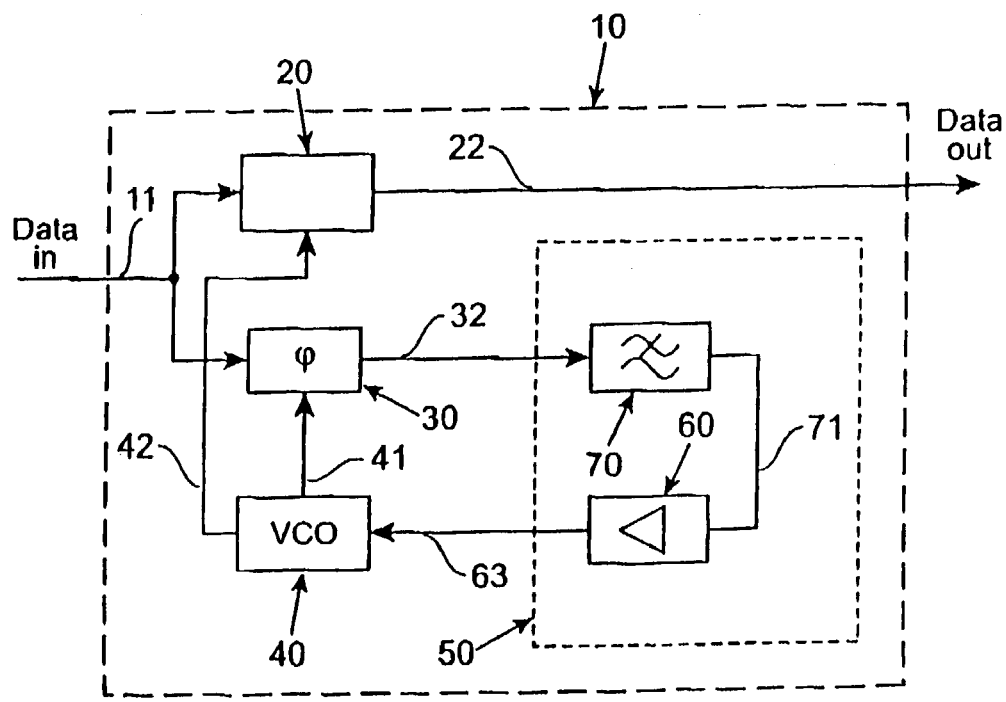
FIG. 2 shows a block diagram of a conventional clock data recovery system.

To resample a clock signal, a clock data recovery circuit 10 as shown in FIG. 2 is conventionally used. The clock data recovery system 10 includes a data sampling unit 20, a phase detector 30, a loop controller 50 containing a low-pass filter 70 and a gain element 60 and a voltage-controlled oscillator 40, which are connected to each other to form a loop as described hereinafter.

The phase detector 30 compares the phase of an incoming data signal stream 11 with a clock signal 41 generated by the voltage-controlled oscillator 40, also referred to as clock generator 40, connected thereto. The phase detector 30 generates at its output a phase difference signal 32 which can be an early or late signal, depending on if a bit transition of the clock signal 41 arrives earlier or later compared to a bit transition of the incoming data signal stream 11. It is also possible that the phase difference signal 32 of the phase detector 30 is numeral, e.g. a digital value or an analogue value indicating the value of the phase difference.

The output of the phase detector 30 is connected to the low-pass filter 70 of the loop controller 50. In the low-pass filter 70 the phase difference signal 32 is low-pass filtered to form a low-pass filtered phase difference signal 71 determining a constant bandwidth of the clock data recovery system 10.

The output of the low-pass filter 70 is connected to the gain element 60 of the loop controller 50 where the filtered phase difference signal 71 is amplified to obtain a control signal 63. The control signal 63 is a control voltage that is applied to the voltage-controlled oscillator 40. The control signal 63 is used to control the frequency and the phase of the voltage-controlled oscillator 40. The gain of the control loop, which comprises the phase detector 30, the clock generator 40 and the loop controller 50, varies with the bit transition density. Therewith also the bandwidth of the control loop varies which is undesirable because very low loop bandwidth does not sufficiently suppress noise and very low bandwidth causes instability.

The voltage-controlled oscillator 40 generates the local clock signal 41, 42 adjusted onto the incoming data signal stream 11. The generated clock signal 42 which corresponds to the clock signal 41 shifted by a predetermined phase, is applied to the data sampling unit 20 where the incoming data signal stream 11 is synchronised using the resampled clock signal 42.

The clock data recovery system 10 generates a control loop error signal from the measurement of the timing between related data transitions of the clock signal 41 and the incoming data signal stream 11. This information is used to increase or decrease the output frequency of the voltage-controlled oscillator 40. The bandwidth of the clock-data-recovery-loop is determined by the number of update measurements divided by the measurement interval. Even though serial data is usually transmitted in a balanced form, e.g. same number of ones and zeros and a constant bit transition rate over a predetermined time period, the short-term bit transition density and therefore the loop-update density may vary considerably. Therefore the loop gain and the loop bandwidth are also varying and not well predictable.

Figure 3:
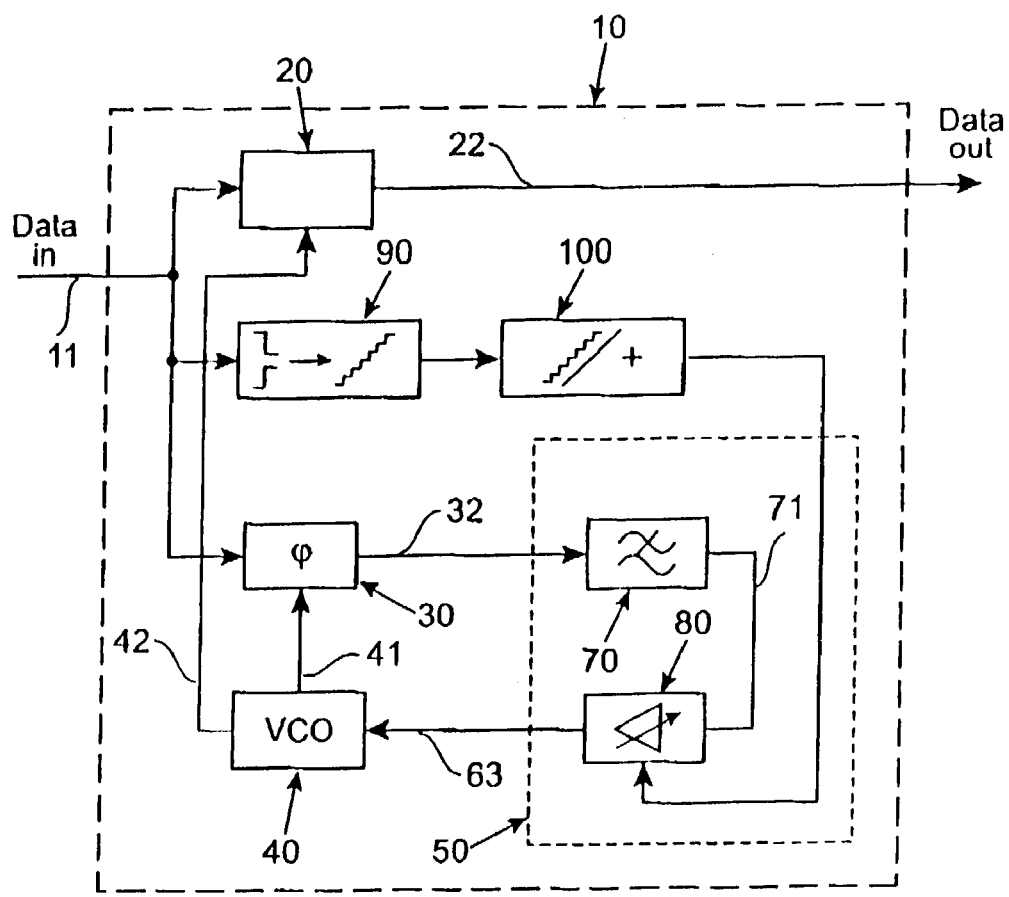
FIG. 3 shows a block diagram of a clock data recovery system according to a preferred embodiment of the present invention.

FIG. 3 shows a block diagram of the clock data recovery system 10 according to a preferred embodiment of the present invention. Like reference numerals are indicating same functional blocks as in FIG. 2.

Additionally to the clock data recovery system 10 as depicted in FIG. 2, a bit transition detector 90 and a density calculator 100 are provided. An input of the bit transition detector 90 is fed with the incoming data signal stream 11. The bit transition detector 90 counts the transitions from zero to one and/or from one to zero per predetermined time interval. The counted value is input to the density calculation device 100 and is processed there to obtain a bit transition rate. That bit transition rate is provided as a gain control signal to a variable-gain element 80. Instead of using a conventional gain element, a variable-gain element 80 is provided in the loop controller 50. The variable-gain element 80 is operable to amplify the low-pass filtered phase difference signal 71 by a gain depending on the bit transition rate provided by the density calculation device 100.

The variable gain has the same effect as varying the bandwidth by e.g. changing the filter characteristics of the low-pass filter 70. In contrast thereto, a variable-gain is easier to implement than an adjustable low-pass filter or the like, because varying a filter characteristic would imply varying a component parameter like capacity or inductivity, which is much more problematic than changing a gain which simply implies the changing of an operational parameter like the voltage.

Figure 4:
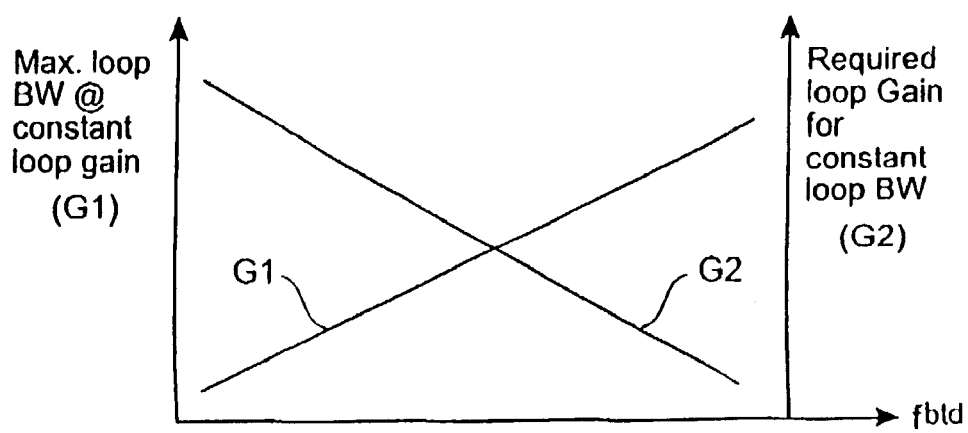
FIG. 4 shows functions of maximum loop bandwidth at constant gain and the loop gain for constant loop bandwidth versus transition density.

With reference to FIG. 4, the function of the maximum loop bandwidth at constant gain versus the bit transition density is depicted as well as the loop gain to safely resample a clock signal from an incoming data signal stream for a constant loop bandwidth.

The number of bit transitions in the incoming data signal stream 11 is counted and the counted value is used to adaptively change the gain of the loop controller 50. The advantage of this approach is that the clock data recovery corrects a timing offset between incoming data signal stream 11 and clock signal 41 in a quicker manner. This improvement is a result of the fact that the residual error of the clock data recovery loop is limited to $1/(1+A)$, wherein A is the open loop gain of the control loop. The higher the gain A is, the smaller is the residual error. Additionally, a higher gain A also increases the loop bandwidth so that errors are corrected faster. However, at an increased bandwidth the jitter of the resampled clock is becoming substantial. This, however, is not necessarily a problem when the resampled clock is not used in other blocks of the system, but only for the decision-making on the data value.

The phase detector 30 has, by design, a certain transfer function between the phase difference at its input and the voltage or current signal at its output 32. This transfer function is referred to as gain of the phase detector 30. In the case of a charge pump design of the phase detector 30, the gain of the phase detector 30 is typically given in Q/Rad/Transition (Charge per Radian of phase offset per Transition). As may be seen, the gain of the phase detector 30 is linearly dependent on the number of bit transitions, and because the phase detector 30 is part of the control loop (30,70,80,40), the total loop gain is also dependent on the number of bit transitions. The variable-gain element 80 counteracts this effect, in that its gain is automatically adjusted to keep the overall loop gain adaptively constant. This also keeps the bandwidth of the loop constant.

Regulating the bandwidth of the system to a constant value provides a stability to the system. Preferably the bandwidth is adapted to be about $1/10$ of the frequency of the transition density of the incoming data signal stream 11. Higher bandwidth can result in an instable system response, and conventional systems are therefore designed with respect to the lowest bandwidth to be expected at the lowest number of bit transitions. This forces a worst-case design that results in a sub-optimum average system performance.

Based on a digital counting of the bit transitions, the control loop gain may be preferably adjusted regarding the counted number of transitions so as to keep the overall loop gain-bandwidth constant. Adjusting the gain of the clock data recovery loop to the changing frequency of the bit transitions of the incoming data signal stream 11 is providing a predictable system by assuring a substantially fixed loop bandwidth.

With reference to FIG. 4, two functions G1, G2 are shown. Graph G1 shows schematically the relation between the bandwidth of the control loop at a constant loop gain A versus the bit transition density. If the gain A of the clock data recovery system is kept constant, the loop bandwidth is increasing while the frequency of the bit transition density increases.

Graph G2 shows schematically the gain A of the clock data recovery loop, i.e. control loop, having a constant bandwidth that indicates that the gain A can be reduced by increasing the bit transition density.

Each block of the embodiment shown can be implemented using either analogue or digital circuits.

What is claimed is:

1. A clock data recovery system for generating a clock signal according to an incoming data signal stream, comprising a clock generator having a control signal input and having a clock signal output, for generating a clock signal, said clock signal having one or more of the frequency and phase of which is dependent upon said signal input, a phase detector with a clock signal input, a data signal input for an incoming data signal stream, and a phase difference signal output, wherein said phase difference signal is related to a phase difference between said generated clock signal and said incoming data signal stream, and a loop controller with a control signal output delivering said control signal, which is dependent on said phase difference signal;

a bit transition detector and a density calculator to determine a bit transition rate of the incoming data signal stream;

wherein said loop controller has a variable gain that is dependent upon the bit transition rate of said incoming data signal stream such that a residual error of a feedback-based control loop formed by the clock generator, the phase detector and the loop controller is limited to $1/(1+A)$, where A is an open-loop gain of the control loop and wherein said control signal is dependent on said variable gain.

2. The clock data recovery system according to claim 1, wherein the variable gain is increased if the bit transition rate decreases, preferably to provide a constant gain-bandwidth-product.

3. The clock data recovery system according to claim 1, wherein said loop controller includes a low-pass filter connected to said phase detector in order to generate from said phase difference signal a low-pass filtered phase difference signal and to adjust the bandwidth of the clock data recovery system.

4. The clock data recovery system according to claim 3, wherein said loop controller includes a variable-gain element which is operable to amplify the low-pass filtered phase difference signal dependent upon said variable gain.

5. The clock data recovery system according to claim 4, wherein said variable-gain element is operable to receive the bit transition rate and to vary the variable gain according to said bit transition rate.

6. The clock data recovery system according to claim 1, wherein said clock generator comprises a voltage-controlled oscillator, and wherein said control signal is a voltage.

7. The clock data recovery system according to claim 1, wherein the bit transition detector and density calculator are operable to determine the bit transition rate by counting the number of bit transitions of the incoming data signal stream per a time interval.

8. A method for generating a clock signal according to an incoming data signal stream, said method comprising the steps of:

generating said clock signal dependent upon a control signal using a clock generator;

detecting a phase difference with a phase detector between the incoming data signal stream and the clock signal;

generating from said phase difference a phase difference signal;

creating from said phase difference signal said control signal, using amplification with a variable gain form a loop controller;

determining a bit transition rate of said incoming data signal stream using a transition rate density calculator;

varying said variable gain based on said bit transition rate such that a residual error of a feedback-based control loop formed by the clock generator, the phase detector and the loop controller is limited to $1/(1+A)$, where A is an open-loop gain of the control loop and wherein said control signal is dependent on said variable gain.

9. The method according to claim 8 wherein the step of creating said control signal further comprises the step of low-pass filtering of said phase difference signal.

10. The method according to claim 8 wherein the step of determining said bit transition rate further comprises the step of detecting a number of bit transitions within a predetermined time interval.

11. The method according to claim 10 wherein the step of determining said bit transition rate further comprises the step of dividing the detected number of bit transitions within said predetermined time interval by a time interval.

* * * * *